(12) United States Patent
Lin

(10) Patent No.: US 7,396,247 B2
(45) Date of Patent: Jul. 8, 2008

(54) DEVICE FOR RETAINING A PRINTED CIRCUIT BOARD

(75) Inventor: Huang-Pin Lin, Chung Ho (TW)

(73) Assignee: Amtran Technology Co., Ltd., Chung Ho, Taipei (TW)

(*) Notice: Subject to any disclaimer, the term of this patent is extended or adjusted under 35 U.S.C. 154(b) by 0 days.

(21) Appl. No.: 11/706,515

(22) Filed: Feb. 14, 2007

(65) Prior Publication Data

US 2008/0102655 A1 May 1, 2008

(30) Foreign Application Priority Data

Oct. 25, 2006 (TW) ............................. 95218850 U

(51) Int. Cl.
*H01R 13/62* (2006.01)
(52) U.S. Cl. ..................... 439/327; 439/76.1
(58) Field of Classification Search ............. 439/327, 439/76.1
See application file for complete search history.

(56) References Cited

U.S. PATENT DOCUMENTS 5,650,917 A * 7/1997 Hsu ........................... 361/759
6,234,810 B1 * 5/2001 Schnell et al. ............. 439/76.1

\* cited by examiner

*Primary Examiner*—Javaid Nasri
(74) *Attorney, Agent, or Firm*—Morris Manning Martin LLP; Tim Tingkang Xia, Esq.

(57) ABSTRACT

A device for retaining a printed circuit board is provided, which includes a first side plate and two second side plates. The first has at least one first rib perpendicularly protruding therefrom, each of the second side plate has at least one second rib perpendicularly protruding therefrom. The second ribs of the two second side plate are located in a same plane, and the plane that the second ribs of the two second side plates are located is spaced from that the first rib is located. When a printed circuit board (PCB) is placed in the device, the first rib presses against one side surface of the PCB, and the second rib press against the other side surface of the PCB, so that the PCB is retained in the device.

16 Claims, 6 Drawing Sheets

DEVICE FOR RETAINING A PRINTED CIRCUIT BOARD

CROSS-REFERENCE TO RELATED APPLICATIONS

This non-provisional application claims priority under 35 U.S.C. §119(a) on Patent Application No(s). 095218850 filed in Taiwan, R.O.C. on Oct. 25, 2006, the entire contents of which are hereby incorporated by reference.

BACKGROUND OF THE INVENTION

1. Field of the Invention

The present invention relates to a circuit board clip apparatus, and more particularly to a clip apparatus using a frame to clip a printed circuit board (PCB).

2. Related Art

Fixing a printed circuit board (PCB) into a housing of an electronic device in the art is achieved by the use of screws or push pins. As for a small PCB, a plurality of fixing holes are formed in the PCB near the edges of the PCB. Then, the PCB is placed onto the housing of an electronic device that the PCB is going to be fixed onto, and the fixing holes of the PCB and the screw holes of the housing are aligned. Screws are then passed through the fixing holes and screwed into the screw holes of the housing, so as to fix the PCB onto the housing. A push pin used to fix the PCB includes a post portion protruding from the housing, a hook portion formed on one end of the post portion, and a base portion form on the other end of the post portion. For fixing the PCB onto the housing with the push pin, the PCB is pressed against the inner side of housing of the electronic device. Then, the latch portion and the post portion of the push pin is passed through the fixing hole of the housing, and the the base portion of the push pin is engaged within the fixing hole of the housing, so as to fix the push pin on the housing. In the meanwhile, the latch portion of the push pin is engaged within the fixing hile of the PCB, or catch the edge of the PCB, so as to fix and support the PCB on the housing.

However, fixing the PCB by the use of screws or push pin has disadvantages. Fixing the PCB by the use of screws is time consuming, and it require to be performed with tools, such as screw driver. During fixng is performed, it is difficult to align the fixing holes of the PCB and the screw holes of the housing of the electronic device, and the screws or the screw driver may be blocked or collided by the parts and components around the PCB. And also, the PCB may be scraped by screws or tools, such as screw drivers, thus fixng with screws is inconvenience. Fixing the PCB by the use of push pin is time saving and convenient, the latch portion of the push pin occupied a portion of surface area of the PCB, that is, this portion of surface area of the PCB must be preserved for push pin, such that it is not economical as for a small PCB with relative small area. The screws for fixing the PCB also occupy portion of surface area of the PCB.

SUMMARY OF THE INVENTION

Fixing the PCB by the use of screws or push pins is time consuming and inconvenient. In view of the above problems, the object of the present invention is to provide a device for retaining a printed circuit board quickly and conveniently without wasting the surface area of the PCB, thereby solving the problems or disadvantages existing in the art.

In order to achieve the above object, a device of the present invention is provided for retaining a printed circuit board, which includes a first side plate and two second side plate extending from the two opposite edges of the first side plate. The first side plate has at least one first rib perpendicularly protruding from the therefrom. Each of the two side plates has at least one second rib perpendicularly protruding therefrom. The two second ribs are located in the same plane, and the plane that the second ribs of the two second side plates are located is spaced from that the first rib is located. The PCB is placed between the two second side plates, wherein the first rib presses against one side surface of the PCB, and the two second ribs press against the other side surface of the PCB.

It is convenient and time saving by the use of the device for retaining the printed circuit board, and screws, push pins, or other latching elements are not required. Also, since screws, push pins are not required, it is not necessary to provide a portion of surface area of the PCB for fixing, thus increasing utilizable surface area of the PCB and effectively reducing the manufacturing cost. The structure of the device also eliminate the problem of scraping the PCB when screwing screws. By grouding the device, electromagnetic interference (EMI) shielding effect is also provided. Furthurmore, the device can be used for a seat of a button to be fixed thereon, thus a button can be presses to contact a swich on the PCB.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given herein below for illustration only, and thus is not limitative of the present invention, and wherein.

DETAILED DESCRIPTION OF THE INVENTION

The present invention is provided to fixing a printed circuit board (PCB) without screws, push pins, or other types of latching elements. When the PCB assembled to or disassembled from a electronic device, the PCB can be removed or fixed quickly, thereby improving the working efficiency.

In order to make the aforementioned and other objectives, features and advantages of the present invention comprehensible, preferred embodiments accompanied with figures are described in detail below.

Figure 1:
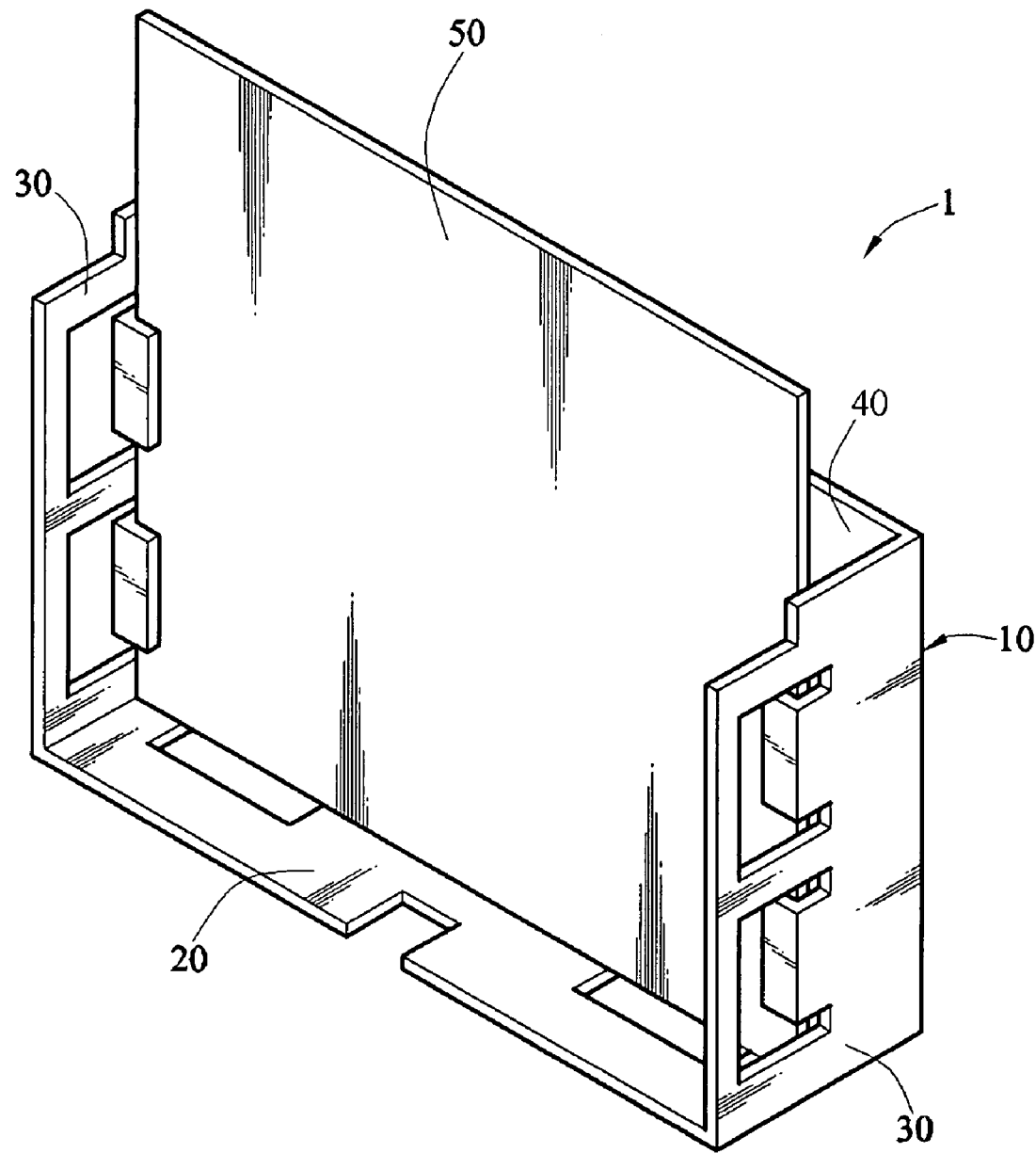
FIG. 1 is a perspective view of a device, that retains a PCB, according to a first embodiment of the present invention.

Referring to FIG. 1, a device 1 for retaining a printed circuit board 50 (PCB) of a first embodiment of the present invention is provided, which includes a fixing frame 10 for fixing the PCB 50 therein.

The fixing frame 10 is made of metal and has a first side plate 20, two second side plates 30, and a third side plate 40. The two second side plates 30 extend from two opposite side edges of the first side plate 20, so that the fixing frame 10 embraces a semi-open region. The third side plate 40 perpendicularly extends from the first side plate 20 and the two second side plates 30. The PCB 50 is placed and retained between the two second side plates 30 of the fixing frame 10.

Figure 2:
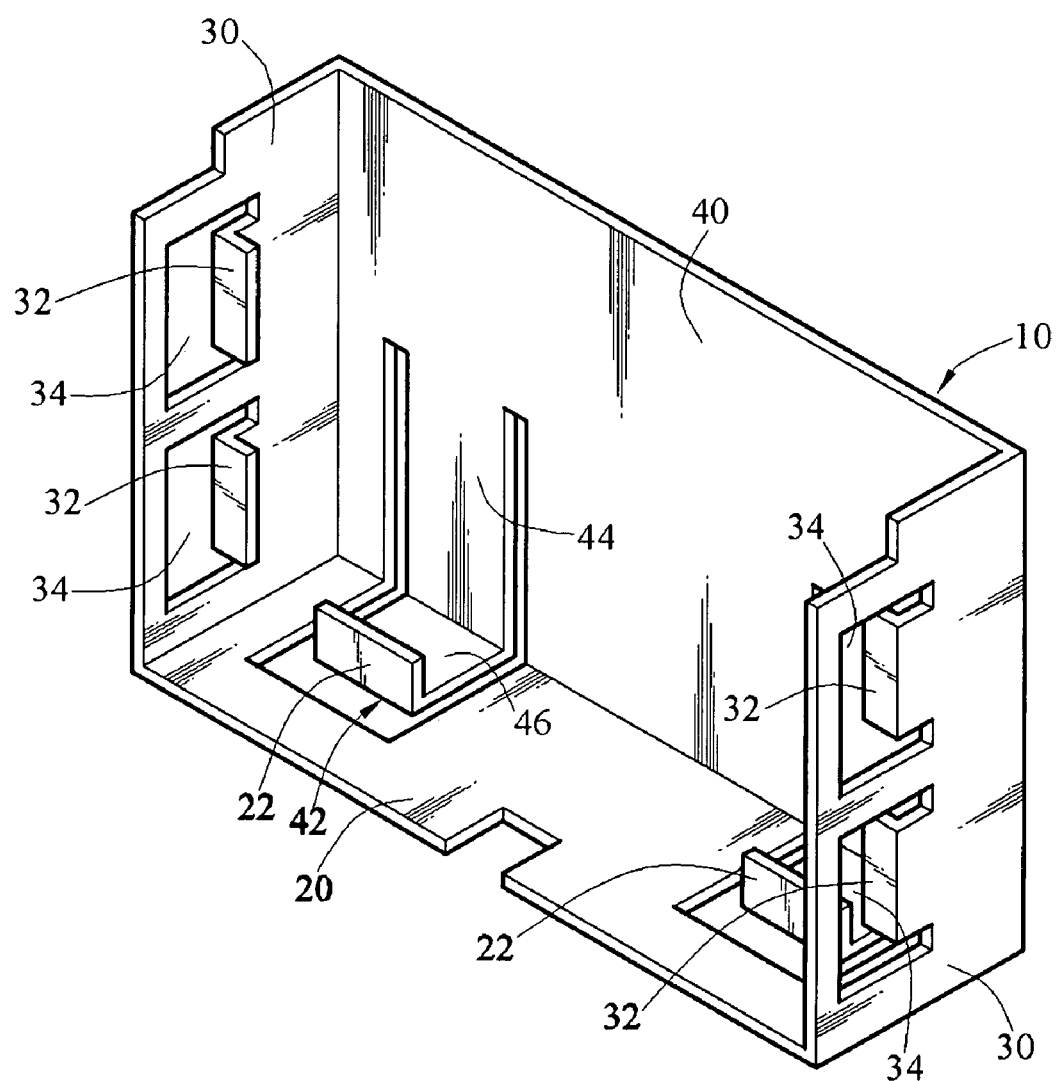
FIG. 2 is a perspective view of the device of the first embodiment of the present invention.
Figure 3:
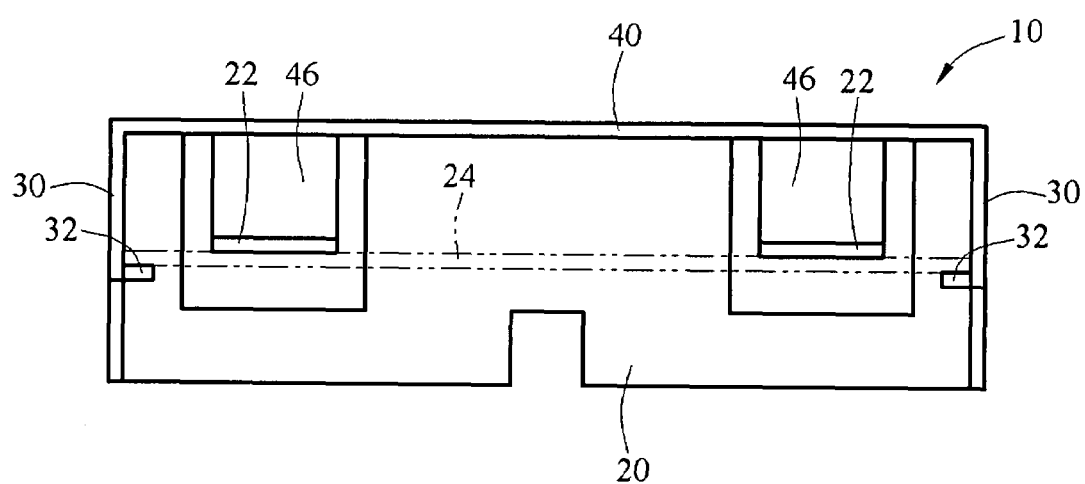
FIG. 3 is a top view of the device of the first embodiment of the present invention.

Referring to FIGS. 2 and 3, the first side plate 20 has two first ribs 22 perpendicularly from the first side plate 20. The two first ribs 22 are located in the same plane and extend inside the fixing frame 10. Each of the second side plates 30 has two second ribs 32 perpendicularly protruding from the two second side plates 30, wherein all the second ribs 32 are located in a same plane, such that two of the second ribs 32 form a couple and the two couples extend along opposite directions inside the fixing frame 10. The plane that the second ribs 32 of the two second side plates 30 are located is spaced for a gap 24 from the plane that the first rib is located. The gap 24 is a space for the PCB 50 to be inserted therein.

Referring to FIGS. 1 and 2, when the PCB 50 is placed on the device 1, the PCB 50 is then inserted in the gap 24 and one bottom edge of the PCB 50 contacts with the first side plate 20 of the fixing frame 10 while the two opposite lateral edges respectively contact with the two second side plates 30 of the fixing frame 10. Meanwhile, the first ribs 22 of the first side plate 20 press against one side of the PCB 50 of the fixing frame 10, and t the second ribs 32 of the two second side plates 30 press the other side of the PCB 50, so that the two side of the PCB 50 are pressed by the first ribs 22 and the second ribs 32, and the left and right sides are pressed by the two second side plates 30. When the electronic device moves or vibrates, the PCB 50 is retained by the device 1, the PCB 50 will not move. Therefore, the electronic components mounted on the PCB 50 will not be easily damaged or fail.

Moreover, each of the second side plates 30 has two fixing holes 34 formed thereon. A seat 60 is retained between the two second side plates 30, and thus an interposed piece (not shown), such as button, is mounted on the seat 60 correspondingly to the PCB 50. Each of the fixing holes 34 and the second ribs 32 are stamped at the same time, and each fixing hole 34 is adjacent to a corresponding one of the second ribs 32, i.e. each second rib 32 extends from the edge of the corresponding fixing hole 34, so that the fixing holes 34 located at different second side plates 20 are disposed correspondingly, as shown in FIGS. 2 and 5.

Figure 5:
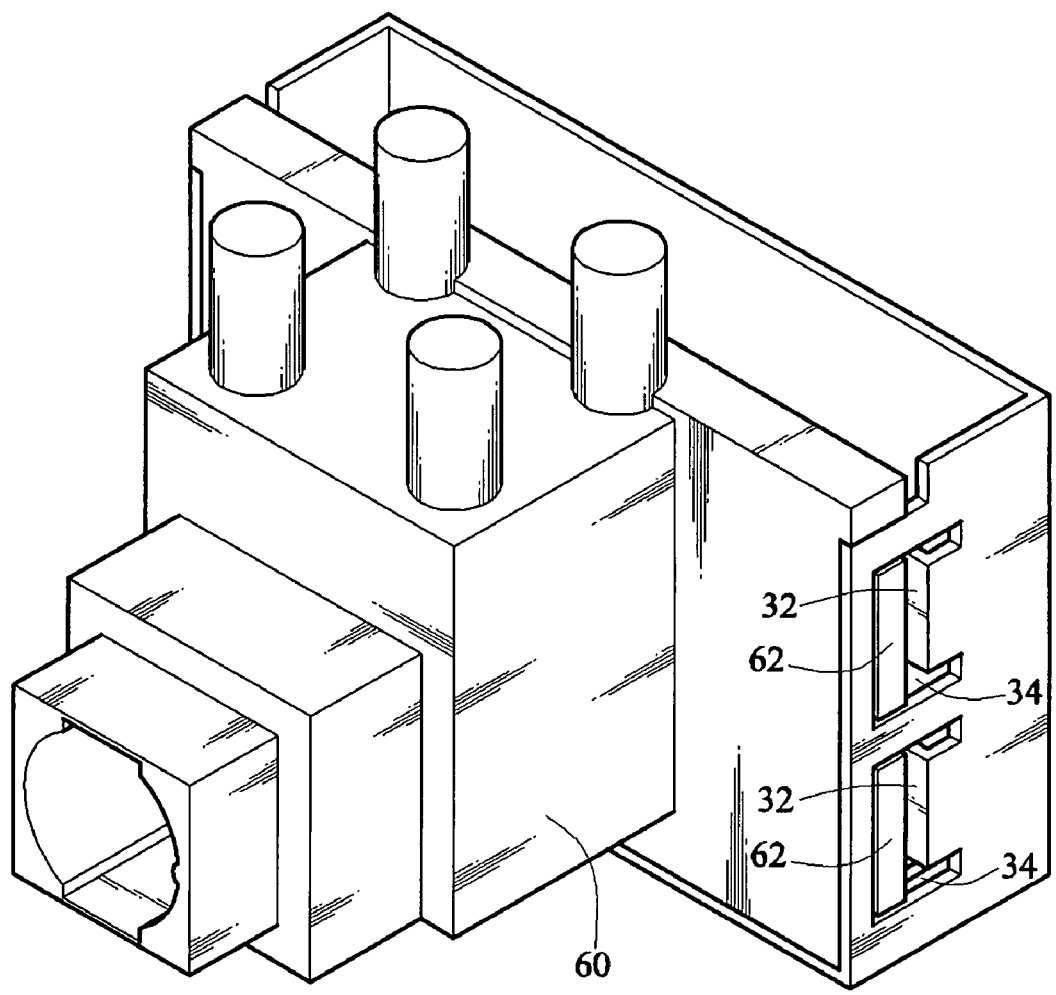
FIG. 5 is a perspective view of the first embodiment of the present invention, when a seat is fixing thereon.

Referring to FIG. 5, the seat 60 has a plurality of bumps 62 formed on two lateral sides of the seat 60, when the seat 60 is placed on the device 1, the bumps 62 on two side edges of the seat 60 engage within the fixing holes 34 formed in the two second side plate 30, and the bottom side of the seat 60 is supported by the second ribs 32 of the two second side plates 30, thereby the seat 60 is retained on the device 1 for retaining the PCB 50.

As shown in FIG. 2, the fixing frame 10 further includes two pressing arms 42 for adjusting the location of the two first ribs 22 according to the PCBs 50 of different thickness. The two pressing arms 42 is stamped out from the first side plate 20, and each of the first ribs 22 is formed by bending a tip end of the pressing arm 42.

Each of the pressing arms 42 has a first piece 44 and a second piece 46 formed monolithically. The first sheet 44 is stamped out from third side plate 40 while the second piece 46 is stamped out from the first piece 44, wherein the second piece 46 perpendicularly extends from the tip end of the first sheet 44. The first ribs 22 extend from the second sheet 46, so as to perpendicularly protrude from the first side plate 20. The gap 24 between the plane where the first ribs 22 are located and the plane where the second ribs 32 are located is smaller than the thickness of the PCB 50, so that the PCB 50 is retained between the first ribs 22 and the second ribs 32. Meanwhile, when the PCB 50 is placed on the fixing frame 10 and inserted in the gap 24, the pressing arm 42 is elastically deformed to change the position of the first ribs 22. That is to say, when the PCB 50 is inserted into the gap 24 defined by the first ribs 22 and the second ribs 32, the first ribs 22 are pushed to move, and thus the pressing arm 42 is deformed to change the position of the first ribs 22 along with the contact state of the PCB 50 and temporarily enlarge the height of the gap 24 defined by the first ribs 22 and the second ribs 32. Thus, it become easier to insert the PCB 50 is disposed into the gap 24 of the fixing frame 10. When the PCB 50 reach the predetermined position, the pressing arm 42 elastically pushes the first ribs 22 to press against the PCB 50, so as to firmly retain the PCB 50.

Figure 4:
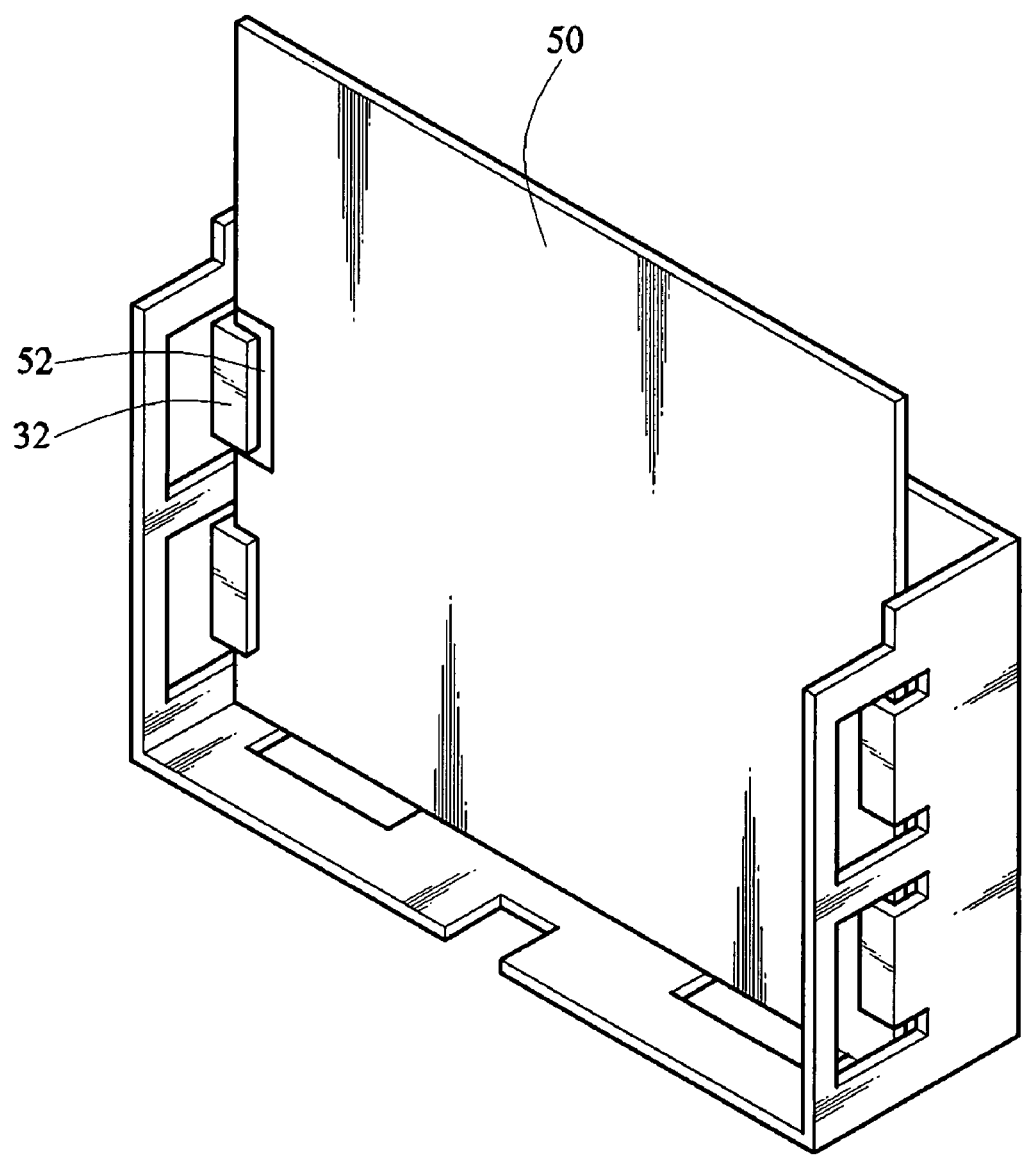
FIG. 4 is a schematic view of the device with the PCB of the first embodiment of the present invention when the PCB electrically grounded.

Referring to FIG. 4, the PCB 50 has a grounding pad 52 formed on the surface of the PCB 50. The grounding pad 52 is provided for contacting one of the second ribs 32 or one of the first ribs 22, so that the grounding pad 52 of the PCB 50 is electrically connected with the fixing frame 10, thus the PCB 50 and the fixing frame 10 are grounded at the same time by using a single grounding path connected to the fixing frame 10. Moreover, since the fixing frame 10 is made of metal and grounded, and the fixing frame 10 surrounds the PCB 50, the electromagnetic interference is shielded by the fixing frame 10, so as to give electromagnetic interference (EMI) shielding effect to the PCB 50.

Figure 6:
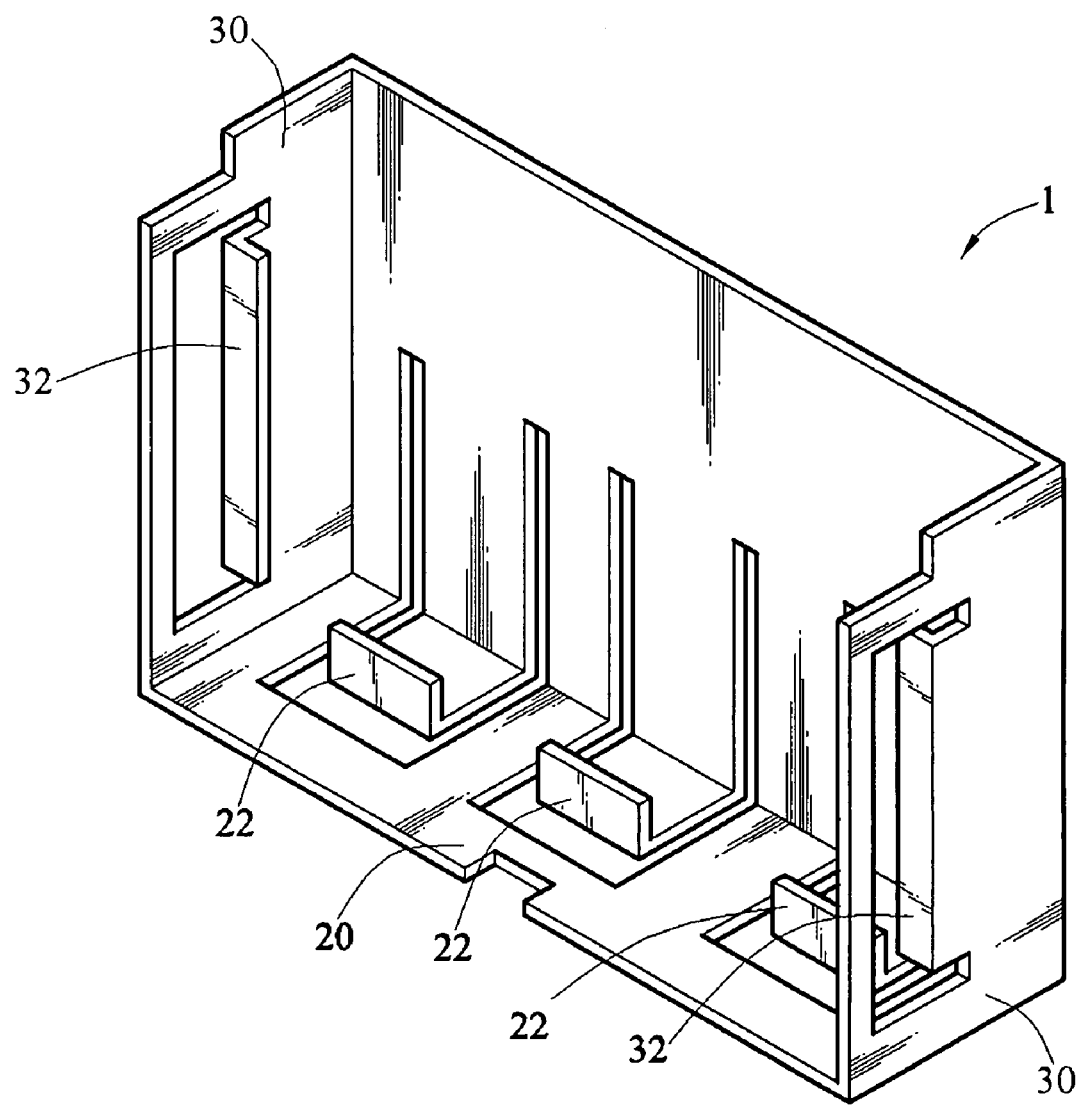
FIG. 6 is a perspective view of a device of a second embodiment of the present invention.

Referring to FIG. 6, a device for retaining a printed circuit board 1 of a second embodiment of the present invention is provided, which similar to the first embodiment except that the number of the first ribs 22 and the second ribs 32 is changed. In the second embodiment, the first side plate 20 has three first ribs 22, and each of the second side plates 30 has a second rib 32. The second ribs 32 of the two second side plates 30 are located in the same plane, and the plane is spaced for a gap from the plane where the first ribs 22 are located, so that the PCB is retained between the first ribs 22 and the second ribs 32.

In the present invention, the number of the first ribs 22 and the second ribs 32 can be increased or decreased according to practical requirements, the number disclosed in the embodiment of the present invention is not limited to one or more first ribs 22 and second ribs 32.

The circuit board clip apparatus can be engaged with the PCB quickly, conveniently, and firmly, so as to prevent the PCB moving. According to the conventional art of fixing the PCB in the product housing uses screws or fasteners to lock, the screw holes of the PCB and the product housing cannot be easily aligned, the locking is time consuming, and a portion of area of the PCB is wasted for clipping and locking. The present invention can effectively eliminate the disadvantages, improve the working efficiency, and solve the problems existing in the conventional art.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A device for retaining a printed circuit board, comprising:
   a first side plate, having at least one first rib protruding therefrom;

two second side plates, extending from two opposite edges of the first side plate, each of the second side plates having at least one second rib protruding therefrom, the two second ribs being located in a same plane, the plane that the second ribs of the two second side plates being located is spaced from that the first rib is located; and at least one pressing arm, stamped out from the first side plate, wherein the first rib is formed by bending a tip end of the pressing arm.

2. The device for retaining a printed circuit board as claimed in claim 1, wherein the first side plate and the second side plates are made of metal.

3. The device for retaining a printed circuit board as claimed in claim 1, wherein each of the second side plate has a fixing hole formed therein.

4. The device for retaining a printed circuit board as claimed in claim 3, further comprising a seat having a plurality of bumps formed on two sides of the seat, wherein the bumps engage within the fixing holes of the two second side plates, so as to fix the seat between the two second side plates.

5. The device for retaining a printed circuit board as claimed in claim 4, wherein the fixing hole of each second side plate is adjacent to the second rib protruding thereon.

6. The device for retaining a printed circuit board as claimed in claim 1, further comprising a third side plate, perpendicularly extending from the first side plate and the two second side plate.

7. The device for retaining a printed circuit board as claimed in claim 1, further comprising a printed circuit board, wherein the first rib presses against one side of the printed circuit board, and the two second ribs presses against the other side of the printed circuit board.

8. The device for retaining a printed circuit board as claimed in claim 7, wherein the PCB has a grounding pad formed on the surface thereof, wherein the grounding is provided for contacting one of the first rib or one of the second ribs.

9. A device for retaining a printed circuit board, comprising:

a first side plate, having at least one first rib protruding therefrom;

two second side plates, extending from two opposite edges of the first side plate, each of the second side plates having at least one second rib protruding therefrom, the two second ribs being located in a same plane, the plane that the second ribs of the two second side plates are located being spaced from that the first rib is located to form a gap for placing the printed circuit board therein; and at least one pressing arm stamped out from the first side plate, wherein the first rib is formed by bending a tip end of the pressing arm.

10. The device for retaining a printed circuit board as claimed in claim 9, wherein the first side plate and the second side plates are made of metal.

11. The device for retaining a printed circuit board as claimed in claim 9, wherein each of the second side plate has a fixing hole formed therein.

12. The device for retaining a printed circuit board as claimed in claim 11, further comprising a seat having a plurality of bumps formed on two sides of the seat, wherein the bumps engage within the fixing holes of the two second side plates, so as to fix the seat between the two second side plates.

13. The device for retaining a printed circuit board as claimed in claim 9, wherein the fixing hole of each second side plate is adjacent to the second rib protruding thereon.

14. The device for retaining a printed circuit board as claimed in claim 9, further comprising a third side plate, perpendicularly extending from the first side plate and the two second side plate.

15. The device for retaining a printed circuit board as claimed in claim 9, wherein the gap is smaller than a thickness of the printed circuit board to retain between the first ribs and the second ribs.

16. A device for retaining a printed circuit board, comprising:

a first side plate, having at least one first rib protruding therefrom; two second side plates, extending from two opposite edges of the first side plate, each of the second side plates having at least one second rib protruding therefrom, the two second ribs being located in a same plane, the plane that the second ribs of the two second side plates are located being spaced from that the first rib is located to form a gap for placing the printed circuit board therein; and a printed circuit board, wherein the first rib presses against one side of the printed circuit board, and the two second ribs presses against the other side of the printed circuit board, wherein the printed circuit board has a grounding pad formed on the surface thereof, wherein the grounding is provided for contacting one of the first rib or one of the second ribs.

* * * * *